(12) United States Patent
Kinugawa et al.

(10) Patent No.: US 9,934,993 B2
(45) Date of Patent: Apr. 3, 2018

(54) ARTICLE TRANSPORT FACILITY

(71) Applicant: Daifuku Co., Ltd., Osaka-shi (JP)

(72) Inventors: Tomotaka Kinugawa, Hinocho (JP); Hiroshi Otsuka, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 3 days.

(21) Appl. No.: 15/428,496

(22) Filed: Feb. 9, 2017

(65) Prior Publication Data

US 2017/0229333 A1    Aug. 10, 2017

(30) Foreign Application Priority Data

Feb. 10, 2016  (JP) .................................. 2016-023764

(51) Int. Cl.
| | |
|---|---|
| *B60L 15/40* | (2006.01) |
| *H01L 21/677* | (2006.01) |
| *B61L 25/02* | (2006.01) |
| *B61L 27/04* | (2006.01) |

(52) U.S. Cl.
CPC ...... *H01L 21/67715* (2013.01); *B61L 25/025* (2013.01); *B61L 27/04* (2013.01); *H01L 21/6773* (2013.01); *H01L 21/67706* (2013.01); *H01L 21/67724* (2013.01); *H01L 21/67727* (2013.01); *H01L 21/67733* (2013.01); *B61L 2201/00* (2013.01)

(58) Field of Classification Search
USPC ........................................................ 700/228
See application file for complete search history.

(56) References Cited

U.S. PATENT DOCUMENTS

2014/0358338 A1\* 12/2014 Harasaki ........... H01L 21/67715
701/19

FOREIGN PATENT DOCUMENTS

JP        2000250628 A       9/2000

\* cited by examiner

*Primary Examiner* — Kyle O Logan
(74) *Attorney, Agent, or Firm* — The Webb Law Firm

(57) ABSTRACT

A controller performs a stop control if a first detector detects that an article transport vehicle traveling in a first path entered a managed area, and a second detector or a third detector detects that another article transport vehicle exists in a selected path. And the controller performs a travel control if the first detector detects that an article transport vehicle traveling in a first path entered the managed area, and presence of another article transport vehicle is not detected in the selected path by the second detector or the third detector.

4 Claims, 12 Drawing Sheets

| First travel | | |
|---|---|---|
| First permission information | Second permission information | Travel control |
| First permission information | Second prohibition information | Stop control |
| First prohibition information | Second permission information | Travel control |
| First prohibition information | Second prohibition information | Stop control |

Fig.13

| Second travel | | |
|---|---|---|
| First permission information | Second permission information | Travel control |
| First permission information | Second prohibition information | Stop control |
| First prohibition information | Second permission information | Stop control |
| First prohibition information | Second prohibition information | Stop control |

…

ARTICLE TRANSPORT FACILITY

CROSS-REFERENCE TO RELATED APPLICATION

This application claims priority to Japanese Patent Application No. 2016-023764 filed Feb. 10, 2016, the disclosure of which is hereby incorporated in its entirety by reference.

FIELD OF THE INVENTION

The present invention relates to an article transport facility comprising an article transport vehicle configured to travel along travel paths to transport an article, a controller for controlling the article transport vehicle, wherein the travel paths include a first path extending from outside a managed area to a branching portion located inside the managed area, a second path and a third path which are two different paths, each of which extends from the branching portion to outside the managed area, wherein a downstream end of the first path, an upstream end of the second path, and an upstream end of the third path are connected together at the branching portion in the managed area, and wherein the controller is configured to select one of the second path and the third paths as a selected path, and to perform a travel control for causing the article transport vehicle to travel along the first path and the selected path, and to perform a stop control for causing the article transport vehicle which entered the managed area to stop in the first path.

BACKGROUND

An example of conventional article transport facilities is described in JP Publication of Application No. 2000-250628 (Patent Document 1). In the article transport facility of Patent Document 1, a check area e1 and a control zone d1 are defined as management areas. In addition, a first travel course L1 and a third travel course L3 are set up as travel paths. The upstream end of the third travel course L3 is connected to the first travel course L1.

An article transport vehicle transmits a first signal when traveling in the first travel course L1 and when traveling in the third travel course L3. And when the article transport vehicle enters the check area e1 of the first travel course L1 and receives the first signal from the article transport vehicle, a controller performs a stop control if the controller receives a first signal from another article transport vehicle that is traveling in the first travel course L1 or the third travel course L3 in the control zone d1. On the other hand, the controller performs a travel control if the controller does not receives a first signal from another article transport vehicle that is traveling in the first travel course L1 or in the third travel course L3 in the control zone d1. The controller thus prevents collisions between article transport vehicles in the managed area by controlling article transport vehicles in this way in the managed area.

SUMMARY OF THE INVENTION

In such an article transport facility, when an article transport vehicle enters a managed area and is traveling in the first travel course in the check area e1, the controller performs a stop control if another article transport vehicle exists in the control zone d1 of the first travel course or the third travel course.

Thus, when one (for example, the first travel course) of the first travel course and the third travel courses is selected as the selected path, the controller performs the stop control if another article transport vehicle exists in the other travel course (the third travel course) even if another article transport vehicle does not exist in the one travel course (the first travel course). And the controller causes the article transport vehicle to remain at rest and wait until the another article transport vehicle no longer exists in the other travel course (the third travel course). However, causing the article transport vehicles to wait in the managed area leads to a lowering of transport efficiency of the entire facility. Thus, in such an article transport facility, it is desirable to improve transport efficiency of the facility by reducing the frequency with which an article transport vehicle is caused to remain at rest and wait when the article transport vehicle enters the managed area, To address this issue, an article transport facility in which its transport efficiency can be improved.

A characteristic arrangement of the article transport facility in accordance with the present invention is that it comprises an article transport vehicle configured to travel along travel paths to transport an article, and a controller for controlling the article transport vehicle, wherein the travel paths include a first path extending from outside a managed area to a branching portion located inside the managed area, a second path and a third path which are two different paths, each of which extends from the branching portion to outside the managed area, wherein a downstream end of the first path, an upstream end of the second path, and an upstream end of the third path are connected together at the branching portion in the managed area, wherein the controller is configured to select one of the second path and the third paths as a selected path, and to perform a travel control for causing the article transport vehicle to travel along the first path and the selected path, and to perform a stop control for causing the article transport vehicle which entered the managed area to stop in the first path. The article transport facility further comprises a first detector configured to detect whether the article transport vehicle traveling in the first path entered the managed area, a second detector configured to detect whether another article transport vehicle exists in a portion of the second path that is in the managed area, and a third detector configured to detect whether another article transport vehicle exists in a portion of the third path that is in the managed area, wherein the controller performs: (a) the stop control if the article transport vehicle is detected by the first detector, and presence of another article transport vehicle in the selected path is detected by the second detector or the third detector, and (b) the travel control if the article transport vehicle is detected by the first detector, and presence of another article transport vehicle is not detected in the selected path by the second detector or the third detector.

With the arrangement described above, when the travel control is performed by the controller, the article transport vehicle travels in the first path and then the selected path (the second path or the third path) and thus through the managed area.

And if the article transport vehicle is detected by the first detector, and presence of another article transport vehicle in the selected path is detected by the second detector or the third detector, the controller suspends the travel control and performs the stop control to cause the article transport vehicle 2 to stop before it reaches the branching portion.

In addition, if the article transport vehicle is detected by the first detector, and presence of another article transport vehicle is not detected in the selected path by the second detector or the third detector, the controller, for example, continues to perform the travel control as before, or performs a momentary stop control and then restarts the travel control to cause the article transport vehicle to travel along the first path and then the selected path.

In other words, when an article transport vehicle enters the managed area, the travel control of the article transport vehicle that entered the managed area is performed to allow and cause it to travel in the selected path if another article transport vehicle does not exist in the selected path, even if another article transport vehicle exists in one of the second path and the third path that was not selected as the selected path. This allows the transport efficiency to be improved compared to a case where the article transport vehicle which enters a managed area caused to stop and remain at rest simply because another article transport vehicle exists in the managed area.

BRIEF DESCRIPTION OF THE DRAWINGS

FIG. 13 is a drawing for describing the travel control and the stop control.

DETAILED DESCRIPTION

Embodiments of an article transport facility in accordance with the present invention are described next with reference to the drawings.

Figure 1:
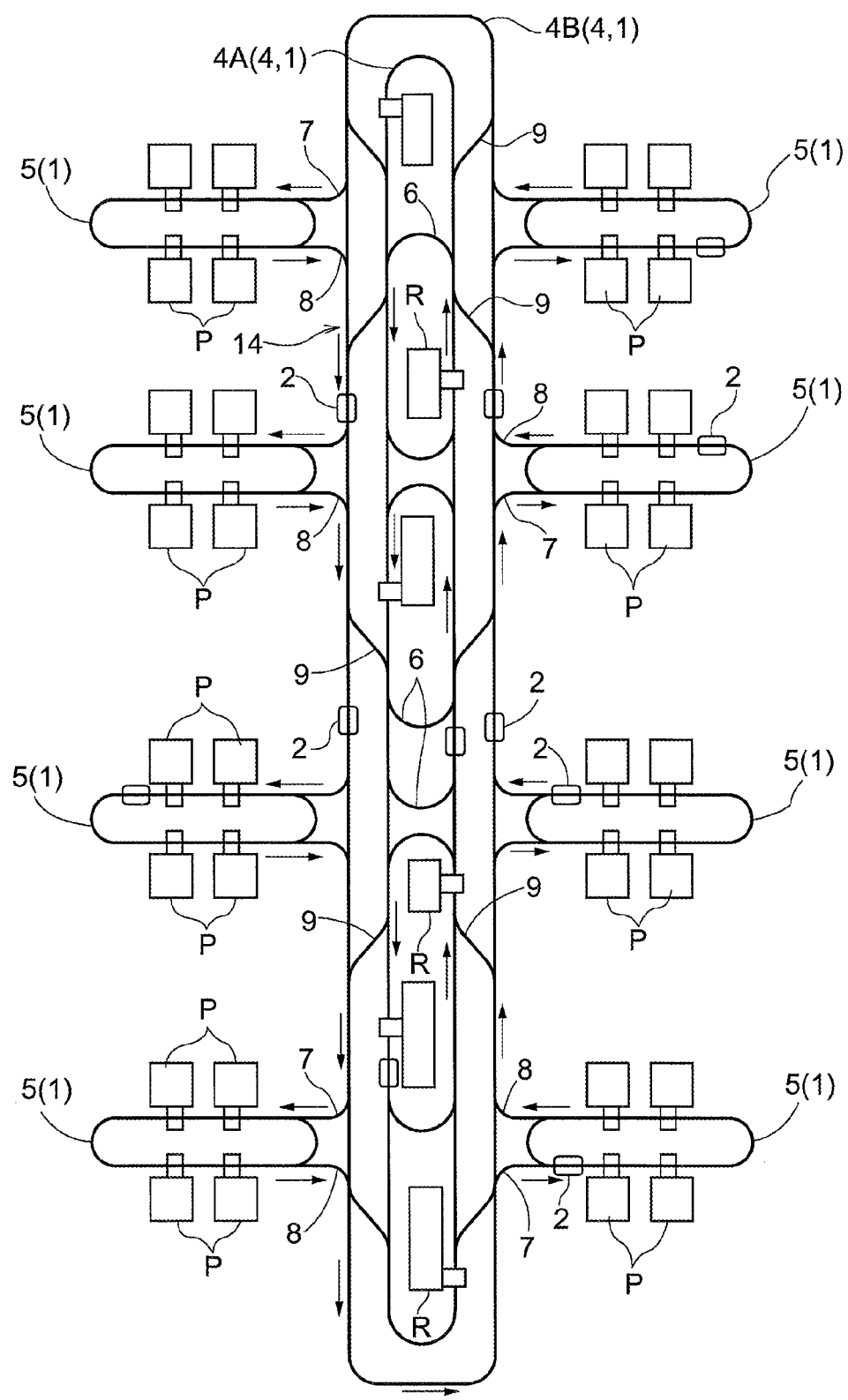
FIG. 1 shows travel paths in an article transport facility.

As shown in FIG. 1, the article transport facility includes article transport vehicles 2 each configured to travel along travel paths 1 to transport articles, and a pair of right and left travel rails 3 (which are sometimes referred to hereinafter simply as travel rails 3) installed along each of the travel paths 1. Note that, in the present embodiment, each of the articles to be transported is a FOUP (Front Opening Unified Pod) for holding one or more semiconductor substrates. Each article transport vehicle 2 transports FOUPs, one FOUP at a time, by traveling on the travel rails 3 which are suspended from and supported by the ceiling.

The travel paths 1 include two primary paths 4 and a plurality of secondary paths 5 each of which extends by way of, or adjacent, a plurality of article processors P (i.e. devices for performing one or more processes on the contents of articles). Each of the two primary paths 4 and the plurality of secondary paths 5 is generally loop-shaped in plan view.

The two primary paths 4 are arranged in a double-loop with one located within the other in plan view. The two primary paths 4 are arranged next to each other along the path width direction. These two loop-shaped primary paths 4 are paths in which a plurality of article transport vehicles 2 travel in the same direction (counterclockwise direction).

Note that the travel directions of the article transport vehicles 2 are indicated by arrows in FIG. 1.

In the following description, of the two primary paths 4, the primary path 4 on the inside will be referred to as a first primary path 4A whereas the primary path 4 on the outside will be referred to as a second primary path 4B.

The first primary path 4A is arranged to extend by way of, or adjacent, a plurality of storage locations R. The first primary path 4A is used as a path for transferring articles in which the article transport vehicles 2 stop to transfer articles to or from the storage locations R. The second primary path 4B is used as a path for continuous traveling in which the article transport vehicles 2 travel continuously.

The travel paths 1 include shortcut paths 6, branching paths 7, merging paths 8, and transfer paths 9.

Each shortcut path 6 is connected to each of a pair of long portions of the first primary path 4A (linear portions that extend vertically in FIG. 1). Each shortcut path 6 is a path for allowing the article transport vehicles 2 to travel (or perform a "shortcut travel") from one of the long portions of the first primary path 4A to another or from another of the long portions to the one of the long portions.

Each branching path 7 is connected to the second primary path 4B and a secondary path 5 and is a path for allowing article transport vehicles 2 to travel from the second primary path 4B to the secondary path 5. Each merging path 8 is connected to a secondary path 5 and the second primary path 4B and is a path for allowing the article transport vehicles 2 to travel from the secondary path 5 to the second primary path 4B.

Each transfer path 9 is connected to the first primary path 4A and the second primary path 4B and is a path for allowing the article transport vehicles 2 to travel from the first primary path 4A to the second primary path 4B or from the second primary path 4B to the first primary path 4A.

[Article Transport Vehicle]

The article transport vehicle 2 is described next.

Note that, in the following description of the article transport vehicle 2, the front and back direction of the article transport vehicle 2 will be referred to as the travel direction whereas the lateral direction of the article transport vehicle 2 will be referred to as the vehicle body lateral direction. In addition, in the description, the right direction and the left direction are defined as seen from the back of the article transport vehicle 2 toward the front. Also in the description, for each travel path 1, a direction along the travel path 1 will be referred to as the path longitudinal direction whereas the direction perpendicular to the path longitudinal direction in plan view will be referred to as the path width direction.

Figure 2:
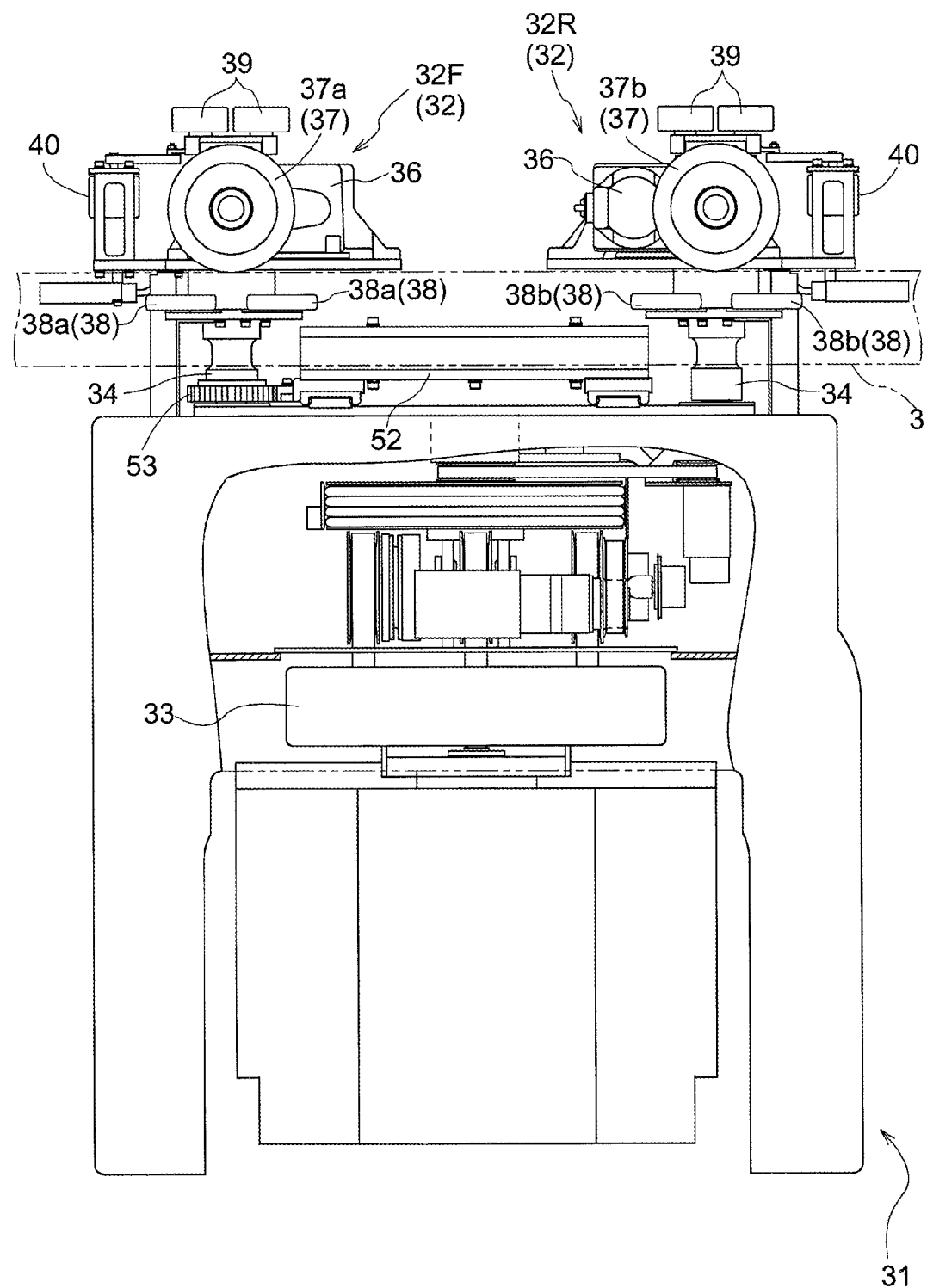
FIG. 2 is a side view of an article transport vehicle.
Figure 3:
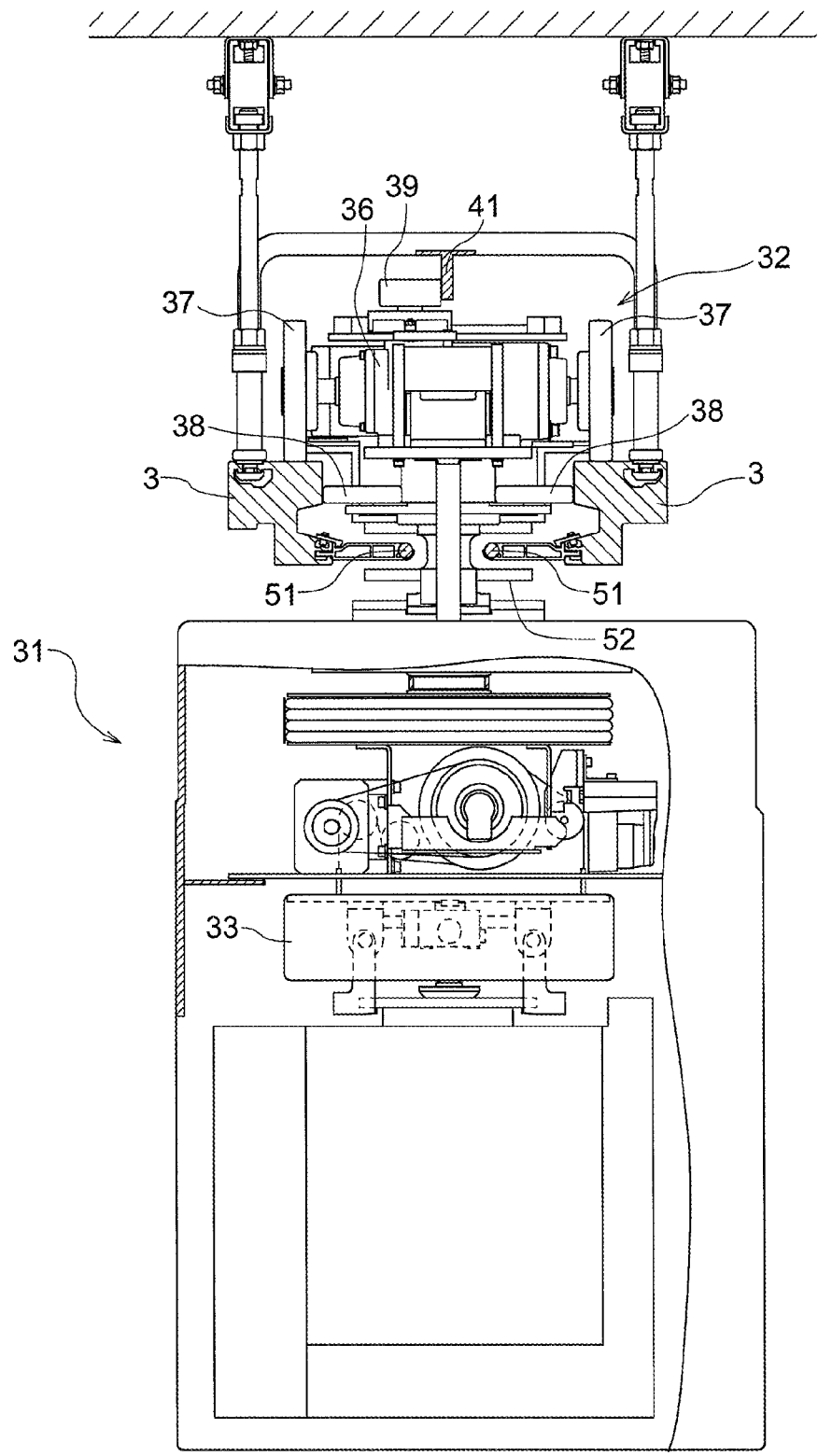
FIG. 3 is a front view of the article transport vehicle.

As shown in FIGS. 2 and 3, each article transport vehicle 2 has travel portions 32 configured to travel on and along the pair of right and left travel rails 3, a vehicle main body 31 which is located below the pair of right and left travel rails 3 and is configured to hold an article, and connecting portions 34 each of which is located between the pair of right and left travel rails 3 for connecting the corresponding travel portion 32 to the vehicle main body 31. The vehicle main body 31 is provided with a support portion 33 configured to support an article with the article suspended from the support portion 33.

The travel portions 32 consist of a front travel portion 32F and a back travel portion 32R located next to, and spaced apart from, each other along the travel direction. Each of the front travel portion 32F and the back travel portion 32R is connected to the corresponding connecting portion 34 such that it can rotate about a vertical axis extending along the vertical direction integrally with the connecting portion 34.

And each of the pair of the front and back connecting portions 34 is rotatably connected to the vehicle main body 31 about corresponding vertical axis extending along the vertical direction.

The front travel portion 32F is equipped with a pair of right and left travel wheels 37 (which will be sometimes referred to as the pair of right and left front wheels 37a) which are driven and rotated by a first motor 36. Each of this pair of right and left travel wheels 37 travels on a travel surface formed in the top surface of the corresponding one of the pair of right and left travel rails 3. The first motor 36 consists of a servo-motor.

In addition, the front travel portion 32F has pairs of right and left guide wheels 38 each of which can rotate freely about a vertical axis extending along the vertical direction. These pairs of right and left guide wheels 38 are located between the pair of right and left travel rails 3 and roll on inward surfaces of the pair of right and left travel rails 3. The front travel portion 32F is equipped with two pairs of right and left guide wheels 38 with one pair spaced apart from the other along the travel direction.

As with the front travel portion 32F, the back travel portion 32R has a pair of right and left travel wheels 37 (which will be sometimes referred to as the pair of right and left rear wheels 37a), and two pairs of right and left guide wheels 38.

The top surface of the vehicle main body 31 is provided with a power-receiving portion 52 to which driving electricity is supplied, without contact, by electricity supply lines 51 installed along each of the pair of right and left travel rails 3. This power-receiving portion 52 is provided between the front and back connecting portions 34 along the travel direction. The power-receiving portion 52 is located between the pair of right and left travel rails 3.

The power-receiving portion 52 is supported for free sliding movement along the vehicle body lateral direction. The power-receiving portion 52 is connected to the front travel portion 32F through an operatively connecting mechanism 53 such that the power receiving portion 52 slides along the vehicle body lateral direction in synchronization with the rotation of the front travel portion 32F about the vertical axis.

Each article transport vehicle 2 is configured travel along the travel path 1 by the virtue of the fact that the travel wheels 37 of the front travel portion 32F and the back travel portion 32R are driven and rotated while its position along the path width direction is restricted by the virtue of the fact that the guide wheels 38 of the front travel portion 32F and the back travel portion 32R are guided by the pair of travel rails 3.

In addition, because each of the front travel portion 32F and the back travel portion 32R can rotate independently of each other about corresponding vertical axis extending along the vertical direction, the article transport vehicle 2 is configured to be able to travel in a travel path 1 even if the travel path 1 is generally circular arc in shape.

As shown in FIG. 2, the front travel portion 32F is provided with a pair of front and back guide auxiliary wheels 39 each which can rotate about an axis extending along the vertical direction, and a second motor 40 which is an actuator for integrally moving the pair of front and back guide auxiliary wheels 39 along the vehicle body lateral direction. The pair of front and back guide auxiliary wheels 39 are located at a higher position than the travel wheels 37 whereas the second motor 40 is located at a higher position than the lower ends of the travel wheels 37.

As with the front travel portion 32F, the back travel portion 32R is provided with a pair of front and back guide auxiliary wheels 39 and a second motor 40.

Figure 5:
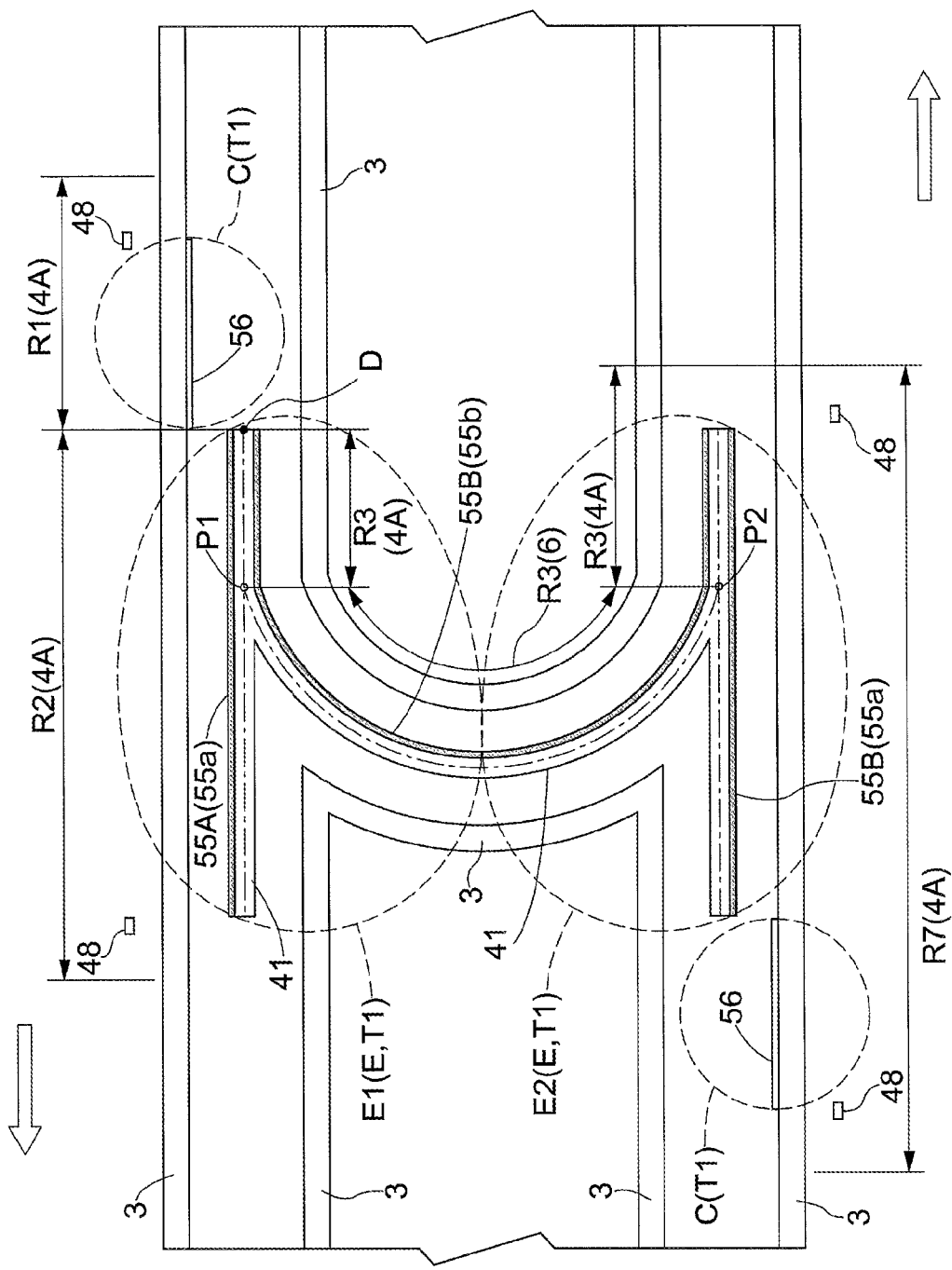
FIG. 5 is a plan view of a shortcut area.
Figure 6:
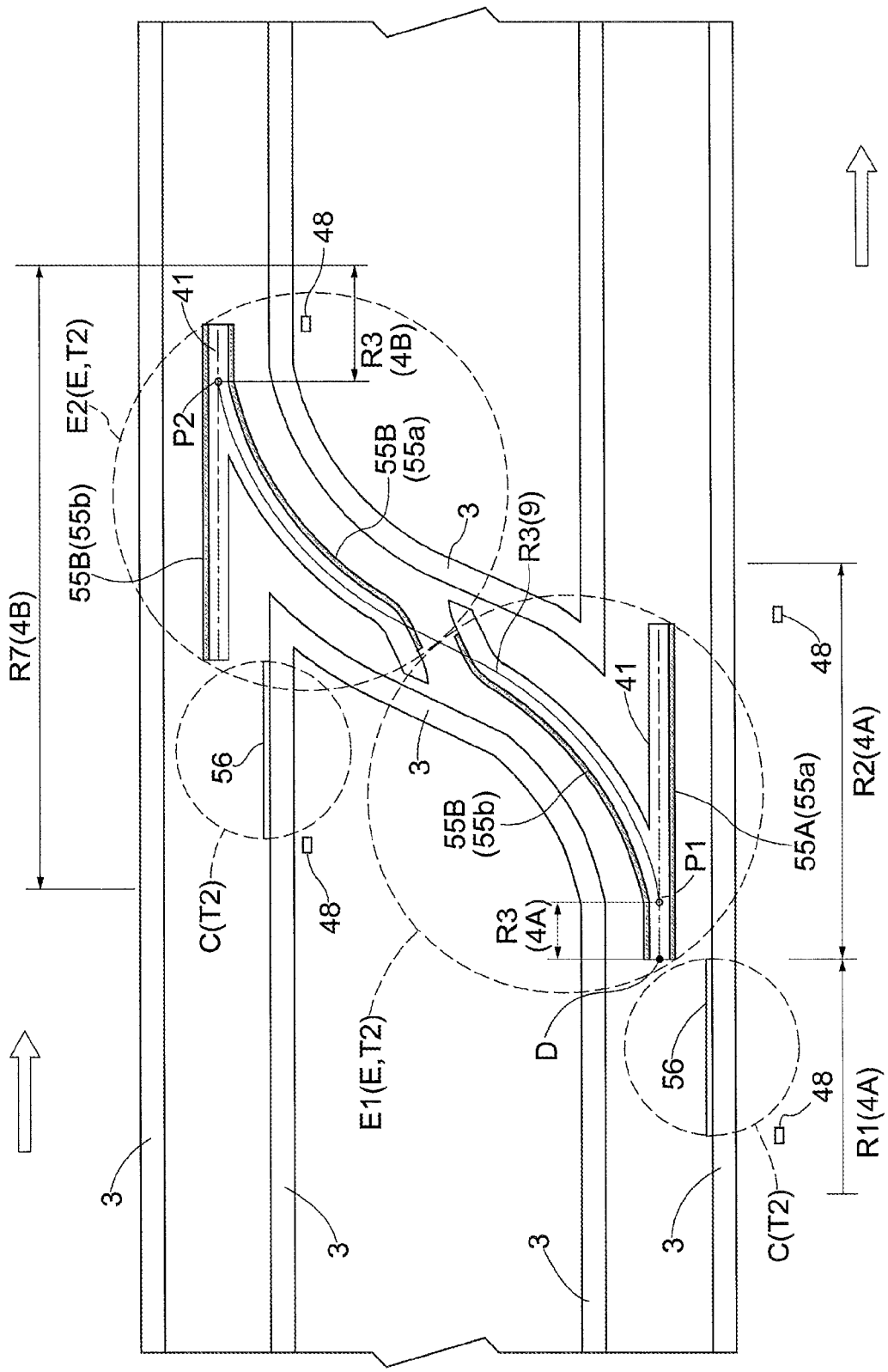
FIG. 6 is a plan view of a transfer area.
Figure 7:
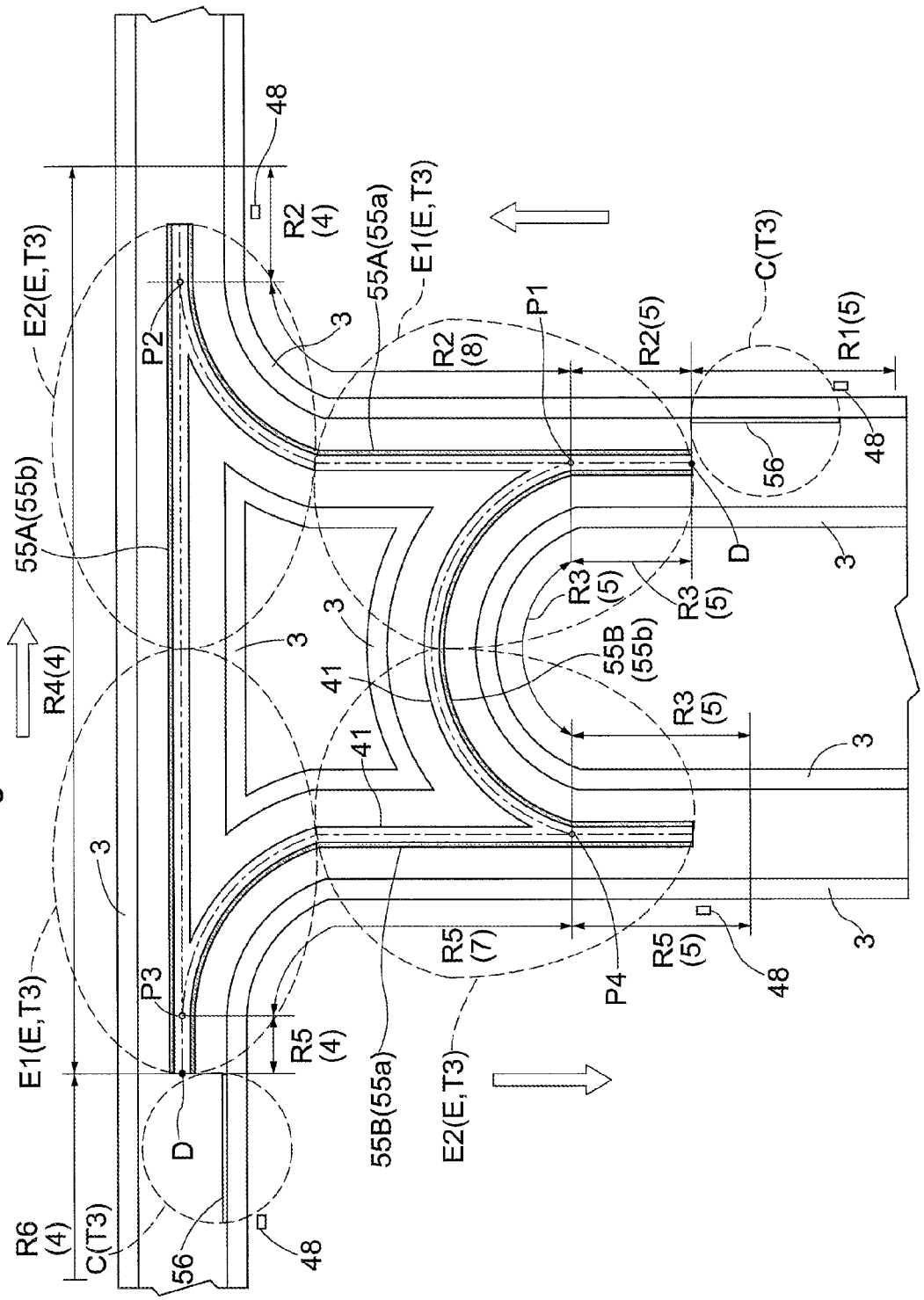
FIG. 7 is a plan view of a branching and merging area.

And as shown in FIGS. 5-7, a guide rail 41 for guiding the guide auxiliary wheels 39 is provided in each connecting area E in which two paths among the travel paths 1 are connected to each other. As shown in FIG. 3, the guide rail 41 is installed at a higher position than the travel rails 3 and at a higher position than the travel wheels 37 which roll on the travel rails 3. In addition, the guide rail 41 is so installed that it is located in a central area between the pair of right and left travel rails 3 as seen along the vertical.

And as shown in FIGS. 2 and 3, the front travel portion 32F is configured to be able to move the position of the pair of front and back guide auxiliary wheels 39 to a right guiding position (which is or, corresponds to, the first position), and a left guiding position (which is, or corresponds to, the second position, and is located leftward of the first position), by the actuating action of the second motor 40. The right guiding position is a position at which the pair of front and back guide auxiliary wheels 39 are located on the right of the center, along the vehicle body lateral direction, of the front travel portion 32F to contact the guide rail 41 from the right hand side. The left guiding position is a position at which the pair of front and back guide auxiliary wheels 39 are located on the left of the center, along the vehicle body lateral direction, of the front travel portion 32F to contact the guide rail 41 from the left hand side.

Note that each of the guide auxiliary wheels 39 is, or corresponds to, is a guided member provided to the article transport vehicle such that each guided member can be moved to the right guiding position and to the left guiding position.

The pair of front and back guide auxiliary wheels 39 provided to the front travel portion 32F and the pair of front and back guide auxiliary wheels 39 provided to the back travel portion 32R are configured to be moved in synchronization with each other to the same guiding position.

In addition, the pair of front and back guide auxiliary wheels 39 are prevented from moving to the right beyond the right guiding position and to the left beyond the left guiding position by a restricting member (not shown). Thus, even when the front and back guide auxiliary wheels 39 are pushed to the right by the guide rail 41 while the pair of front and back guide auxiliary wheels 39 are located in the right guiding position, for example, the pair of front and back guide auxiliary wheels 39 are maintained in the right guiding position by the restricting action of the restricting portion. However, when the front and back guide auxiliary wheels 39 are acted on by a force directed to the left while the pair of front and back guide auxiliary wheels 39 are located in the right guiding position, the pair of front and back guide auxiliary wheels 39 are allowed to be moved toward the left guiding position.

Figure 4:
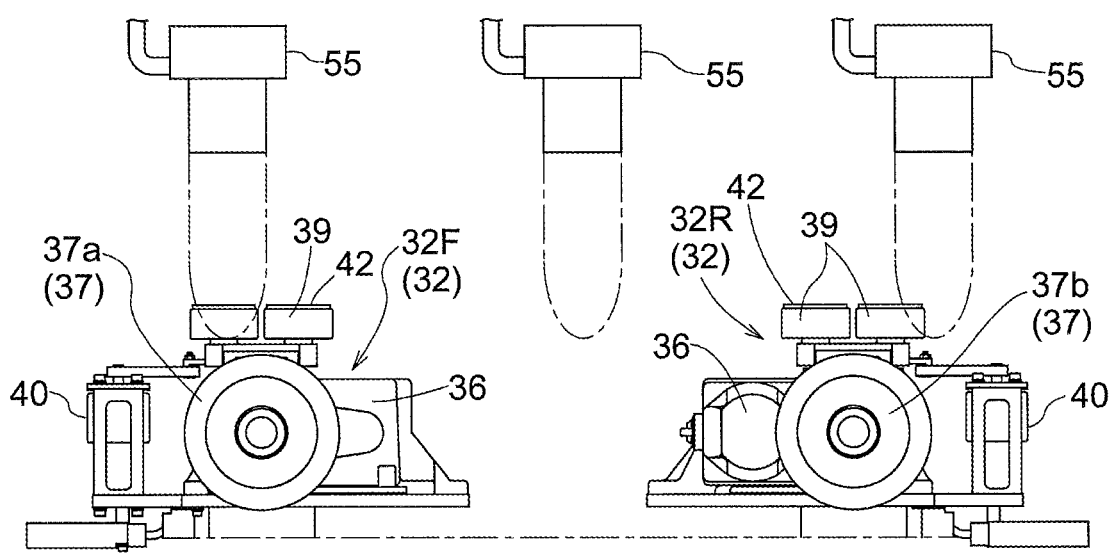
FIG. 4 is a side view showing travel portions and detected portions.

As shown in FIG. 4, the article transport vehicle 2 is provided with detected portions 42 each of which is moved along the vehicle body lateral direction integrally with the pair of front and back guide auxiliary wheels 39. Each detected portion 42 consists of a magnet which is generally sheet-shaped, and is attached to the top surface of corresponding one of the front and back guide auxiliary wheels 39 with each guide auxiliary wheel 39 having a detected portion 42 attached thereto. In other words, as each pair of front and back guide auxiliary wheels 39 are moved along the vehicle body lateral direction by the actuating action of the second motor 40, the detected portions 42 attached on the pair of front and back guide auxiliary wheels 39 are also moved along the vehicle body lateral direction. Note that the detected portions 42 are not shown in the drawings other than FIG. 4.

Figures 11, 12:
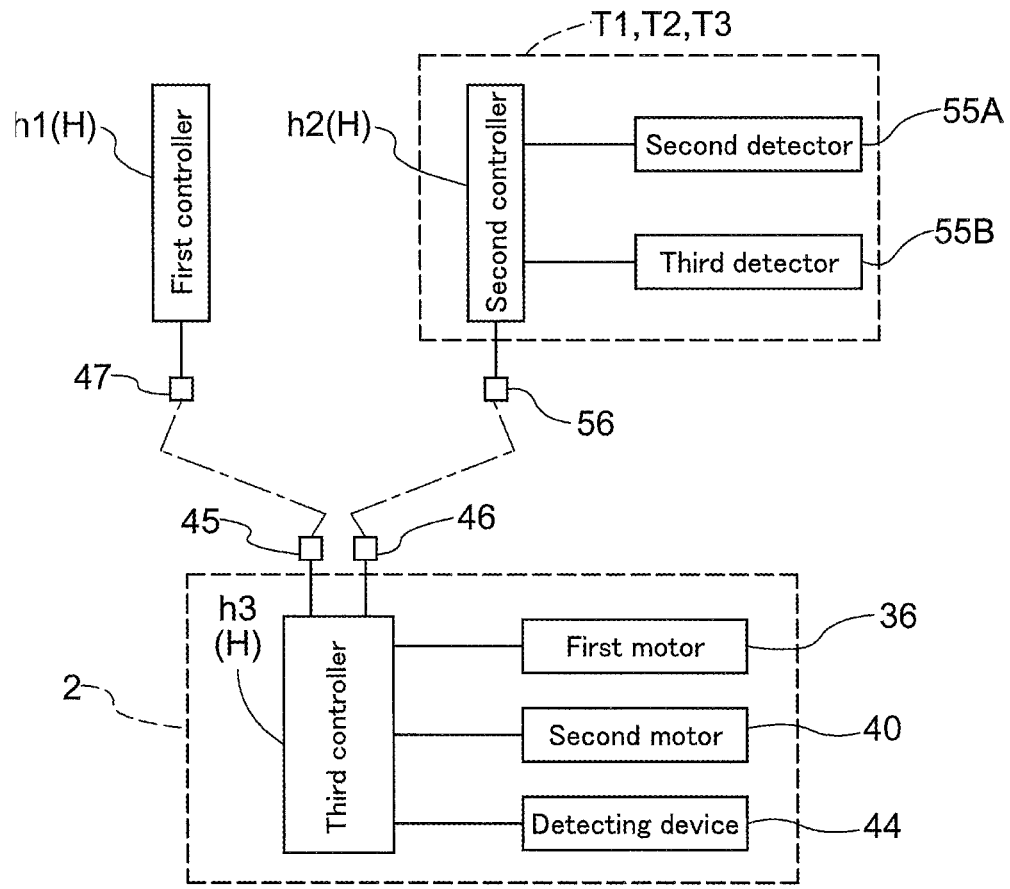
FIG. 11 is a control block diagram.
FIG. 12 is a drawing for describing a travel control and a stop control.

As shown in FIG. 11, each article transport vehicle 2 is provided with a detecting device 44, a transmitter-receiver 45, a receiver 46, and a third controller h3.

The detecting device 44 is a device for detecting detected members 48 (see, for example, FIG. 5) installed at locations along the travel path 1. Each detected member 48 contains address information which indicates the position at which the detected member 48 is installed. The detecting device 44 is configured to detect the detected members 48 and also to read in the address information contained in the detected members 48 that are detected. A plurality of detected members 48 are installed along the travel path 1, and also at both the entrance and the exit to each managed area T. In addition, the detecting device 44 is, or corresponds to, the first detector for detecting that an article transport vehicle 2 traveling along the first path R1 entered a managed area T.

The transmitter-receiver 45 is a device that receives information from the first controller h1 described below, and that also transmits address information read in with the detecting device 44 to the first controller h1. The receiver 46 is a device that receives information from the second controller h2 described below.

The third controller h3 controls the article transport vehicle 2 based on information received with the transmitter-receiver 45 (information received from the first controller h1), and information received with the receiver 46 (information received from the second controller h2).

As shown in FIGS. 5-7, in each area in which two of the travel paths 1 are connected to each other, the area in which a guide rail 41 is installed is referred to as a connecting area E. In addition, the area which is adjacent to a connecting area E and in which the receiver 46 of the article transport vehicle 2 can receive information from a communication device 56 is referred to as a communication area C. Note that, in the present embodiment, the communication device 56 extends over the entire width of the corresponding communication area C. The communication device 56 can communicate with an article transport vehicle 2 in the entire communication area C.

And among the connecting areas E, each area E in which the article transport vehicle 2 changes paths (or performs a "branching travel") from a primary path 4 or a secondary path to another path (e.g., a shortcut path 6 or a branching path 7, etc.) is referred to as a branching area E1. Among the connecting areas E, each area E in which the article transport vehicle 2 changes paths (or performs a "merging travel") from a path (e.g., merging path 8 and transfer path 9, etc.) to a primary path 4 or a secondary path is referred to as a merging area E2.

And a plurality of managed areas T each including at least one branching area E1 are defined for the travel paths 1. In the present embodiment, the managed areas T include shortcut areas T1, transfer areas T2, and branching and merging areas T3.

As shown in FIG. 5, a shortcut area T1 is defined as an area near a shortcut path 6 that contains the shortcut path 6. The shortcut area T1 includes one branching area E1 and one merging area E2 that correspond to, or are associated with, one shortcut path 6, in addition to two communication areas C that correspond to, or associated with, the one shortcut path 6.

In the shortcut area T1, the upstream end of the shortcut path 6 in the branching area E1 is connected to the first primary path 4A by a first connecting portion P1. And the downstream end of the shortcut path 6 in the merging area E2 is connected to the first primary path 4A by a second connecting portion P2.

As shown in FIG. 6, a transfer area T2 is defined as an area near a transfer path 9 that contains the transfer path 9. The transfer area T2 includes one branching area E1 and one merging area E2 that correspond to, or are associated with, one transfer path 9, in addition to two communication areas C that correspond to, or are associated with, the one transfer path 9.

As shown in FIG. 6, in the case where a transfer path 9 is used as a path for article transport vehicles 2 to change paths from the first primary path 4A to the second primary path 4B, the upstream end of the transfer path 9 in the branching area E1 is connected to the first primary path 4A by a first connecting portion P1, in the transfer area T2 defined for the transfer path 9. And the downstream end of the transfer path 9 in the merging area E2 is connected to the second primary path 4B by a second connecting portion P2.

While not shown, in the case where a transfer path 9 is used as a path for article transport vehicles 2 to change paths from the second primary path 4B to the first primary path 4A, the upstream end of the transfer path 9 is connected to the second primary path 4B. And the downstream end of the transfer path 9 is connected to the first primary path 4A.

As shown in FIG. 7, a branching and merging area T3 is defined as an area near one branching path 7 and one merging path 8 (the branching path 7 and the merging path 8 that are connected to the same single secondary path 5) that contains the one branching path 7 and the one merging path 8. The branching and merging area T3 includes one branching area E1 and one merging area E2 that correspond to, or are associated with, the branching path 7, in addition to one branching area E1 and one merging area E2 that correspond to, or are associated with, the merging path 8, as well as two communication areas C.

In the branching and merging area T3, the upstream end of the merging path 8 in one of the branching areas E1 is connected to a secondary path 5 by a first connecting portion P1. And the downstream end of the merging path 8 in one of the merging areas E2 is connected to the primary path 4 (second primary path 4B) by a second connecting portion P2. In addition, in the branching and merging area T3, the upstream end of the branching path 7 in the other of the branching areas E1 is connected to the primary path 4 by a third connecting portion P3. And the downstream end of the branching path 7 in the other of the merging areas E2 is connected to the secondary path 5 by a fourth connecting portion P4.

The travel paths 1 in the branching and merging area T3 are described next in more detail.

Such travel paths 1 includes a first path R1 that extends from outside the branching and merging area T3 to a branching portion D of the secondary path 5 that is located inside the branching and merging area T3, in addition to a second path R2 and a third path R3 which are two different paths with each extending from the branching portion D of the secondary path 5 to outside the branching and merging area T3. The branching portion D of the secondary path 5 is located upstream of the first connecting portion P1, and is located at the upstream end of the branching area E1 in which this first connecting portion P1 exists.

In addition, the travel paths 1 further includes a sixth path R1 that extends from outside the branching and merging area T3 to a branching portion D of the primary path 4 that is located inside the branching and merging area T3, in addition to a fourth path R4 and a fifth path R5 which are two different paths with each extending from the branching portion D of the primary path 4 to outside the branching and merging area T3. The branching portion D of the primary path 4 is located upstream of the third connecting portion P3, and is located at the upstream end of the branching area E1 in which this third connecting portion P3 exists.

The fourth path R4 joins the second path R2 at the second connecting portion P2 which is a portion in the branching and merging area T3. The fifth path R5 joins the third path R3 at the fourth connecting portion P4 which is a portion in the branching and merging area T3.

The downstream end of the first path R1, the upstream end of the second path R2, and the upstream end of the third path R3 are connected to one another at the branching portion D in the secondary path 5 in the branching and merging area T3. The downstream end of the sixth path R6, the upstream end of the fourth path R4, and the upstream end of the fifth path R5 are connected to one another at the branching portion D of the primary path 4 in the branching and merging area T3.

An intermediate portion of the second path R2 and an intermediate portion of the fourth path R4 are connected together at the second connecting portion P2 in the branching and merging area T3. The portion of the path that is downstream of the second connecting portion P2 is a part of both the second path R2 and the fourth path R4. An intermediate portion of the third path R3 and an intermediate portion of the fifth path R5 are connected together at the fourth connecting portion P4 in the branching and merging area T3. The portion of the path that is downstream of the fourth connecting portion P4 is a part of both the third path R3 and the fifth path R5.

And portions of the second path R2 that are further downstream are farther away toward right from the third path R3. Incidentally, a path lateral direction is, or corresponds to, a direction (lateral direction) that crosses the travel direction of the article transport vehicle 2 as seen along the vertical direction. In addition, the rightward direction is, or corresponds to, the one direction along the lateral direction (first lateral first direction) whereas the leftward direction is, or corresponds to, the other direction along the lateral direction (second lateral first direction).

A guide rail 41 extends along each of the second path R2, the third path R3, the fourth path R4, and the fifth path R5 in the branching and merging area T3 (except in the communication areas C). A guide rail 41 is arranged to branch off or splits at the first connecting portion P1 and at the third connecting portion P3, whereas a guide rail 41 is arranged to merge into another at the second connecting portion P2 and at the fourth connecting portion P4.

Each path (the first path R1 through the sixth path R6) in the branching and merging area T3 is formed as follows.

As shown in FIG. 7, the first path R1 is formed by a portion of the secondary path 5 that extends upstream from the branching portion D. The second path R2 is formed by a portion of the secondary path 5 that extends from the branching portion D to the first connecting portion P1, the merging path 8, and a portion of the primary path 4 that extends downstream from the second connecting portion P2 by a preset distance. The third path R3 is formed by a portion of the secondary path 5 that extends from the branching portion D to the fourth connecting portion P4, and a portion of the secondary path 5 that extends downstream from the fourth connecting portion P4 by a preset distance. The fourth path R4 is formed by a portion of the primary path 4 that extends from the branching portion D to the second connecting portion P2, and a portion of the primary path 4 that extends downstream from the second connecting portion P2 by a preset distance. The fifth path R5 is formed by a portion of the primary path 4 that extends from the branching portion D to the third connecting portion P3, the branching path 7, and a portion of the secondary path 5 that extends downstream from the fourth connecting portion P4. The sixth path R6 is formed by a portion of the primary path 4 that extends upstream from the branching portion D.

As shown in FIGS. 5 and 6, each of the shortcut areas T1 and the transfer areas T2 includes a first path R1, a second path R2, and a third path R3, as with the case of the branching and merging area T3. In addition, the shortcut area T1 is further provided with a seventh path R7 which extends to inside the shortcut area T1 from outside the shortcut area T1. The transfer area T2 is further provided with a seventh path R7 which extends to inside the transfer area T2 from outside the transfer area T2. An intermediate portion of the third path R3 and an intermediate portion of the seventh path R7 are connected together at the second connecting portion P2 in the shortcut area T1, and at the second connecting portion P2 in the transfer area T2. And the portion of the path that is downstream of the second connecting portion P2 is a part of both the third path R3 and the seventh path R7.

Each path (the first path R1 through the third path R3, and the seventh path R7) in a shortcut area T1 is formed as follows.

As shown in FIG. 5, the first path R1 is formed by a portion of the first primary path 4A that extends upstream from the branching portion D. The second path R2 is formed by a portion of the first primary path 4A that extends downstream from the branching portion D. The third path R3 is formed by a portion of the first primary path 4A that extends from the branching portion D to the first connecting portion P1, the shortcut path 6, and a portion of the first primary path 4A that extends downstream from the second connecting portion P2. The seventh path R7 is formed by a portion of the first primary path 4A that extends both upstream and downstream from the second connecting portion P2.

Each path (the first path R1 through the seventh path R7) in a transfer area T2 is formed as follows.

As shown in FIG. 6, the first path R1 is formed by a portion of the first primary path 4A that extends upstream from the branching portion D. The second path R2 is formed by a portion of the first primary path 4A that extends downstream from the branching portion D. The third path R3 is formed by a portion of the first primary path 4A that extends from the branching portion D to the first connecting portion P1, the transfer path 9, and a portion of the second primary path 4B that extends downstream from the second connecting portion P2. The seventh path R7 is formed by a portion of the second primary path 4B that extends both upstream and downstream from the second connecting portion P2.

As shown in FIG. 11, provided to each of a plurality of managed areas T are detectors 55A, 55B for detecting any article transport vehicles 2 that travel in the managed area T, a communication device 56 for transmitting information (presence information) on whether there is an article transport vehicle 2 detected by the detectors 55A, 55B, and a second controller h2 described above.

As shown in FIGS. 5-7, each first detecting member 55a that functions as a detecting member 55 for detecting the guide auxiliary wheels 39 located in the right guiding position is installed on the right hand side of the guide rail 41. Each second detecting member 55b that functions as a detecting member 55 for detecting the guide auxiliary wheels 39 located in the left guiding position is installed on the left hand side of the guide rail 41. Each detecting member 55 consists of a plurality of magnet sensors which detect the magnetic field generated by the detected portions 42.

Each second controller h2 is configured such that, if it determines that an article transport vehicle 2 exists in the managed area T based on the detection information from the first detecting member 55a and the second detecting member 55b, it transmits information that indicates the path in which the article transport vehicle 2 exists in the managed area T with the communication device 56.

As shown in FIG. 5, within a shortcut area T1, a first detecting member 55a is installed along the second path R2 and the seventh path R7 whereas a second detecting member 55b is installed along the third path R3.

As shown in FIG. 6, within a transfer area T2, a first detecting member 55a is installed along the second path R2 and along a portion of the third path R3 that is located in the merging area E2. In addition, within a transfer area T2, a second detecting member 55b is installed along a portion of the third path R3 that is located in the branching area E1, and along the seventh path R7.

As shown in FIG. 7, within a branching and merging area T3, a first detecting member 55a is installed along the second path R2 and along the fifth path R5. In addition, within a branching and merging area T3, a second detecting member 55b is installed along the third path R3 and along the fourth path R4.

As shown in FIGS. 4-7, the detecting member 55 installed along the second path R2 is, or corresponds to, the second detector 55A configured to detect whether another article transport vehicle 2 exists in a portion of the second path R2 that is in the branching and merging area T3. This second detector 55A is a second detecting device installed along the second path R2 configured to detect the guide auxiliary wheels 39 located in the right guiding position.

A second detecting member 55b (or both the first detecting member 55a and the second detecting member 55b) installed along the third path R3 is, or corresponds to, the third detector 55B configured to detect whether another article transport vehicle 2 exists in a portion of the third path R3 that is in the branching and merging area T3. This third detector 55B is a third detecting device which is installed along the third path R3 and is provided to detect the guide auxiliary wheels 39 located in the left guiding position.

In addition, the second detector 55A also includes a second detecting member 55b installed along the fourth path R4. In other words, in a branching and merging area T3, the second detector 55A detects whether any article transport vehicle 2 exists in a portion of the fourth path R4 in the branching and merging area T3, as well as in a portion of the second path R2 that is in the branching and merging area T3.

In addition, the third detector 55B also includes a first detecting member 55a installed along the fifth path R5. In other words, in a branching and merging area T3, the third detector 55B detects whether any article transport vehicle 2 exists in a portion of the fifth path R5 in the branching and merging area T3, as well as in a portion of the third path R3 that is in the branching and merging area T3.

Thus, in a managed area T, a first detecting member 55a is installed along any path along which the article transport vehicle 2 travels with the guide auxiliary wheel 39 located in the right guiding position. And a second detecting member 55b is installed along any path along which the article transport vehicle 2 travels with the guide auxiliary wheel 39 located in the left guiding position.

[Control-Related Arrangement]

As shown in FIG. 11, the article transport facility is provided with controllers H for controlling the article transport vehicles 2.

The controllers H include a first controller h1, second controllers h2, and third controllers h3. Each controller H includes a CPU and peripheral circuits including a memory circuit and a communication circuit for communicating with various components, and may be a microcomputer, with algorithms in the form of software that is stored and executable by the CPU for performing the required functions disclosed in the present specification. The first controller h1 is a controller for controlling the traveling of the article transport vehicles 2 in the entire travel paths 1 including branching and merging areas T3, etc. The second controllers h2 are controllers for controlling the traveling of the article transport vehicles 2 in the shortcut areas T1, the transfer areas T2, and the branching and merging areas T3. Two or more second controllers h2 are provided to each of these area. The first controller h1 and the second controllers h2 are fixed to the floor surface, for example, so that they may not be moved. And each of the plurality of article transport vehicles 2 has a third controller h3.

Based on a transport command from a superordinate controller (not shown), the first controller h1 transmits, to an article transport vehicle 2, transport information, such as information on an article processor P specified as a transport origin or a transport destination for an article, or information on a storage location R specified as a location at which an article is to be picked up. In addition, the first controller h1 leans and keeps track of the position of the article transport vehicle 2 based on address information (position information) which indicates the travel position of the article transport vehicle 2 and which is transmitted from the article transport vehicle 2 traveling along the travel paths 1.

Each third controller h3 performs a travel control for causing the article transport vehicle 2 to travel to a target stop position that corresponds to an article processor P or a storage location R based on the transport information, a transfer control in which the article transport vehicle 2 transfers an article to or from the article processor P or the storage location R with the article transport vehicle 2 at rest at the target stop position, and a stop control for causing the article transport vehicle 2 that has entered an area (a shortcut area T1, a transfer area T2, or a branching and merging area T3) to stop in the area. In the travel control, the address information read with the detecting device 44 during the traveling of the article transport vehicle 2 is transmitted to the first controller h1.

In the travel control performed by the third controller h3, one of the two branched paths in an branching area E1 is selected as the selected path.

More specifically, for example, when an article transport vehicle 2 is traveling along a secondary path 5 (first path R1) and enters a branching and merging area T3, the path splits, or branches, into two paths, namely, the second path R2 and the third path R3 in a branching area E1. In the travel control, one of the second path R2 and the third path R3 is selected as a selected path depending on the target stop position. And the article transport vehicle 2 is controlled so that the article transport vehicle 2 travels along the first path R1 and the selected path (the second path R2 or the third path R3).

And when an article transport vehicle 2 is traveling along the main path 4 (sixth path R6) and enters a branching and merging area T3, the path splits, or branches, into two paths, namely, the fourth path R4 and the fifth path R5 in a branching area E1. In the travel control, one of the fourth path R4 and the fifth path R5 is selected as a selected path depending on the target stop position. And the article transport vehicle 2 is controlled so that the article transport vehicle 2 travels along the sixth path R6 and the selected path (the fourth path R4 or the fifth path R5).

In other words, the travel control for causing the article transport vehicle 2 to travel to a target stop position is a control for causing the article transport vehicle 2 to travel along the first path R1 (or sixth path R6) and the selected path.

A controller H performs a stop control if an article transport vehicle 2 which enters a managed area T is detected by a detecting device 44 AND presence of another article transport vehicle 2 in a selected path (i.e., an article transport vehicle 2 that is different from the article transport vehicle 2 which entered the managed area T) is detected by a second detector 55A or a third detector 55B. Thus, when an article transport vehicle 2 that enters the managed area T is detected by a detecting device 44, if presence of another article transport vehicle 2 in a selected path is detected by a second detector 55A or a third detector 55B, then the travel control is suspended and a stop control is performed for the article transport vehicle 2 which has entered the managed area T. Thus, by performing a stop control in this manner, the article transport vehicle 2 which entered the managed area T is caused to stop before it reaches the first connecting portion P1 (i.e., stops in the first path R1).

In addition, the controller H performs a travel control if an article transport vehicle 2 which enters a managed area T is detected by a detecting device 44 AND presence of another article transport vehicle 2 is not detected in a selected path by a second detector 55A or a third detector 55B. Thus, when an article transport vehicle 2 that enters the managed area T is detected by a detecting device 44, if presence of another article transport vehicle 2 is not detected in a selected path by a second detector 55A or a third detector 55B, then the controller H continues to perform the travel control. Thus, with the travel control being continued to be performed, the article transport vehicle 2 that entered the managed area T continues to travel in and through the managed area T.

Next, a control performed by a controller H when an article transport vehicle 2 travels in a communication area C and then in a branching area E1 in the managed area T (first travel) is described. Note that a first travel can be, or correspond to, any of (a) traveling along the first primary path 4A and entering a branching area E1 of a shortcut area T1, (b) traveling along the first primary path 4A and entering a branching area E1 of a transfer area T2, and (c) traveling along a secondary path 5 and entering a branching area E1 of a branching and merging area T3.

The first controller h1 transmits first permission information to the third controller h3 of the article transport vehicle 2 that is performing a first travel, if the first controller h1 determines that another article transport vehicle 2 does not exist in the managed area T. In addition, the first controller h1 transmits first prohibition information to the third controller h3 of the article transport vehicle 2 that is performing the first travel, if the first controller h1 determines that another article transport vehicle 2 exists in the managed area T.

More specifically, the first controller h1 transmits first permission information to the third controller h3 of the article transport vehicle 2 that is performing the first travel if it determines that another article transport vehicle 2 does not exist in both the second path R2 and the third path R3 in the managed area T. In addition, the first controller h1 transmits first prohibition information to the third controller h3 of the article transport vehicle 2 that is performing a first travel if it determines that another article transport vehicle 2 exists in at least one of the second path R2 and the third path R3 in the managed area T.

The second controller h2 transmits second permission information from the communication device 56 if presence of another article transport vehicle 2 is not detected in a selected path by the second detector 55A and the third detector 55B. Thus, if an article transport vehicle 2 enters the managed area T and is in a communication area C when the second controller h2 is transmitting the second permission information from the communication device 56, the second permission information transmitted from the communication device 56 is received by the transmitter-receiver 45 of the article transport vehicle 2 in question.

Thus, a second controller h2 transmits second permission information to the third controller h3 if an article transport vehicle 2 that enters the managed area T is detected by a detecting device 44 AND presence of another article transport vehicle 2 is not detected in a selected path by the second detector 55A and the third detector 55B.

In addition, the second controller h2 transmits second prohibition information from the communication device 56 if presence of another article transport vehicle 2 in a selected path is detected either by the second detector 55A or the third detector 55B. Thus, if an article transport vehicle 2 enters the managed area T and is in a communication area C when the second controller h2 is transmitting the second prohibition information from the communication device 56, the second prohibition information transmitted from the communication device 56 is received by the transmitter-receiver 45 of the article transport vehicle 2 in question.

Thus, a second controller h2 transmits second prohibition information to the third controller h3 if an article transport vehicle 2 that enters the managed area T is detected by a detecting device 44 AND the presence of another article transport vehicle 2 in a selected path is detected by the second detector 55A or the third detector 55B.

And a second controller h2 installed for a branching and merging area T3 transmits the second permission information and the second permission information by also taking into consideration whether or not presence of another article transport vehicle 2 in a subject path is detected by the second detector 55A or the third detector 55B.

In other words, a second controller h2 provided for a branching and merging area T3 transmits second prohibition information to the third controller h3 if an article transport vehicle 2 that enters the managed area T is detected by a detecting device 44 AND presence of another article transport vehicle 2 is detected in at least one of a selected path and a subject path by the second detector 55A and the third detector 55B. In addition, a second controller h2 provided for a branching and merging area T3 transmits second permission information to the third controller h3 if an article transport vehicle 2 that enters the managed area T is detected by a detecting device 44 AND presence of another article transport vehicle 2 is not detected in either of a selected path and a subject path by the second detector 55A and the third detector 55B.

If the third controller h3 of an article transport vehicle 2 that is performing the first travel is receiving second permission information from the communication device 56 when the article transport vehicle 2 is traveling in a communication area C, the third controller h3 performs a travel control. In addition, the third controller h3 of an article transport vehicle 2 that is performing a first travel receives second prohibition information from the communication device 56 while the article transport vehicle 2 is traveling in a communication area C, the third controller h3 suspends the travel control and performs the stop control.

Thus, when the article transport vehicle 2 is performing a first travel, regardless of whether first permission information or second permission information is received, the third controller h3 of an article transport vehicle 2 performs the stop control if second prohibition information is received and performs a travel control if the second permission information is received. (See FIG. 12.)

Next, a control performed by a controller H when an article transport vehicle 2 travels in a communication area C and then in a merging area E2 in the managed area T (second travel) is described. Note that a second travel can be, or correspond to, either of (a) traveling along the first primary path 4A and entering a merging area E2 of a shortcut area T1 and (b) traveling along the second primary path 4B and entering a merging area E2 of a transfer area T2.

Here, as described above, when an article transport vehicle 2 performs a first travel, various kinds of information is transmitted to the third controller h3 of the article transport vehicle 2 which is performing the first travel based on whether or not another article transport vehicle 2 exists in either, or both of, the second path R2 and the third path R3.

On the other hand, the case in which an article transport vehicle 2 performs a second travel is different from the case in which an article transport vehicle 2 performs a second travel in that, in the case of a second travel, the path for which the determination is made as to whether or not another article transport vehicle 2 exists in them is one or both of the third path R3 and the seventh path R7. Other aspects are the same as those in the case of an article transport vehicle 2 performing a first travel.

That is, when an article transport vehicle 2 performs a second travel, the first controller h1 transmits first permission information and first prohibition information to the third controller h3 of the article transport vehicle 2 that is performing a second travel, as with the case of an article transport vehicle 2 performing a first travel.

In this case, the second controller h2 transmits second permission information and second prohibition information to the third controller h3 of the article transport vehicle 2 that is performing the second travel, as with the case of an article transport vehicle 2 performing a first travel.

And if the article transport vehicle 2 is performing a second travel, the third controller h3 of the article transport vehicle 2 performs the stop control if the third controller h3 receives at least one of the first prohibition information and the second prohibition information and performs a travel control if the third controller h3 receives both the first permission information and the second permission information. (See FIG. 13.)

Figure 8:
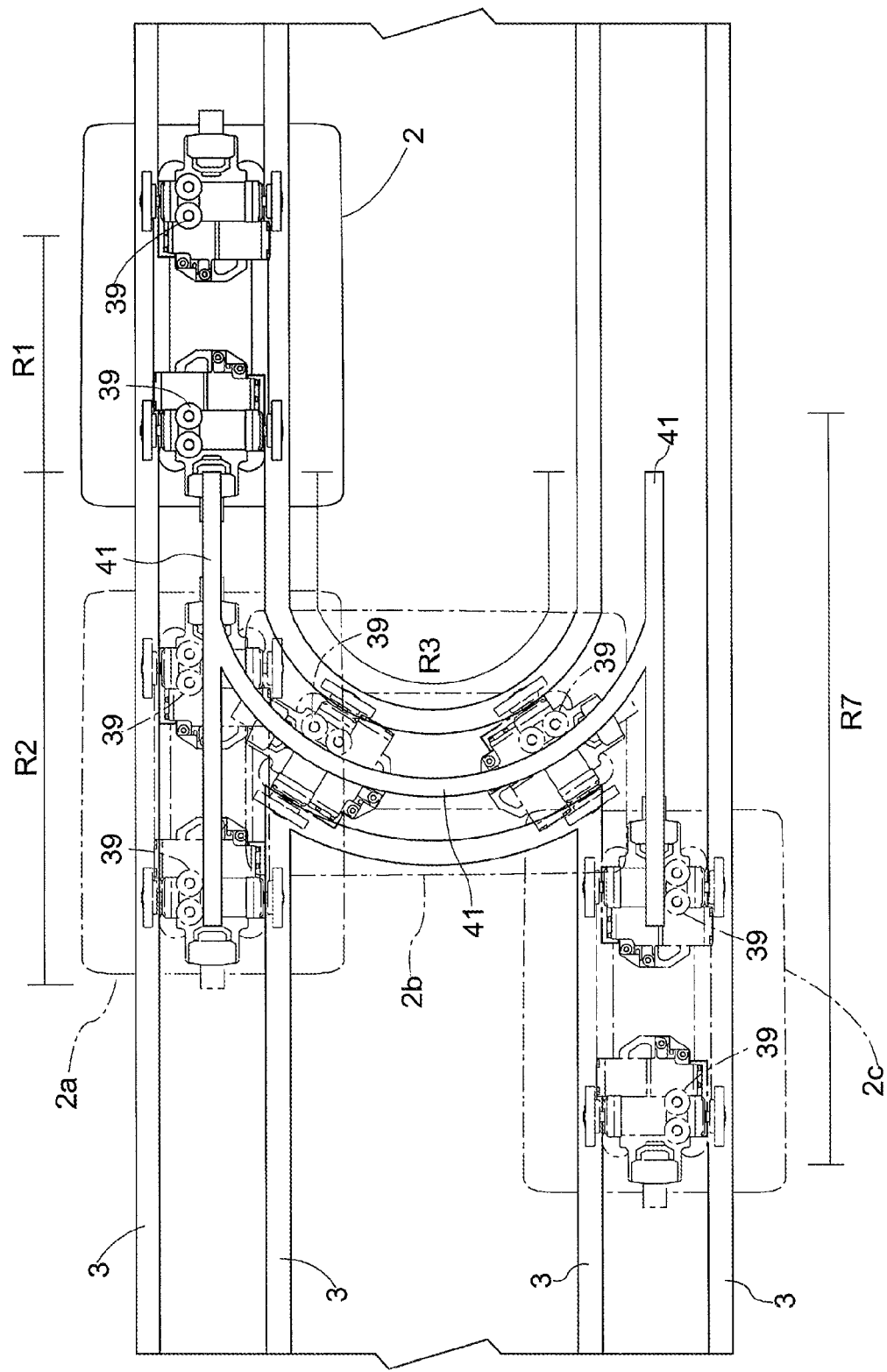
FIG. 8 shows how an article transport vehicle travels in a shortcut area.
Figure 9:
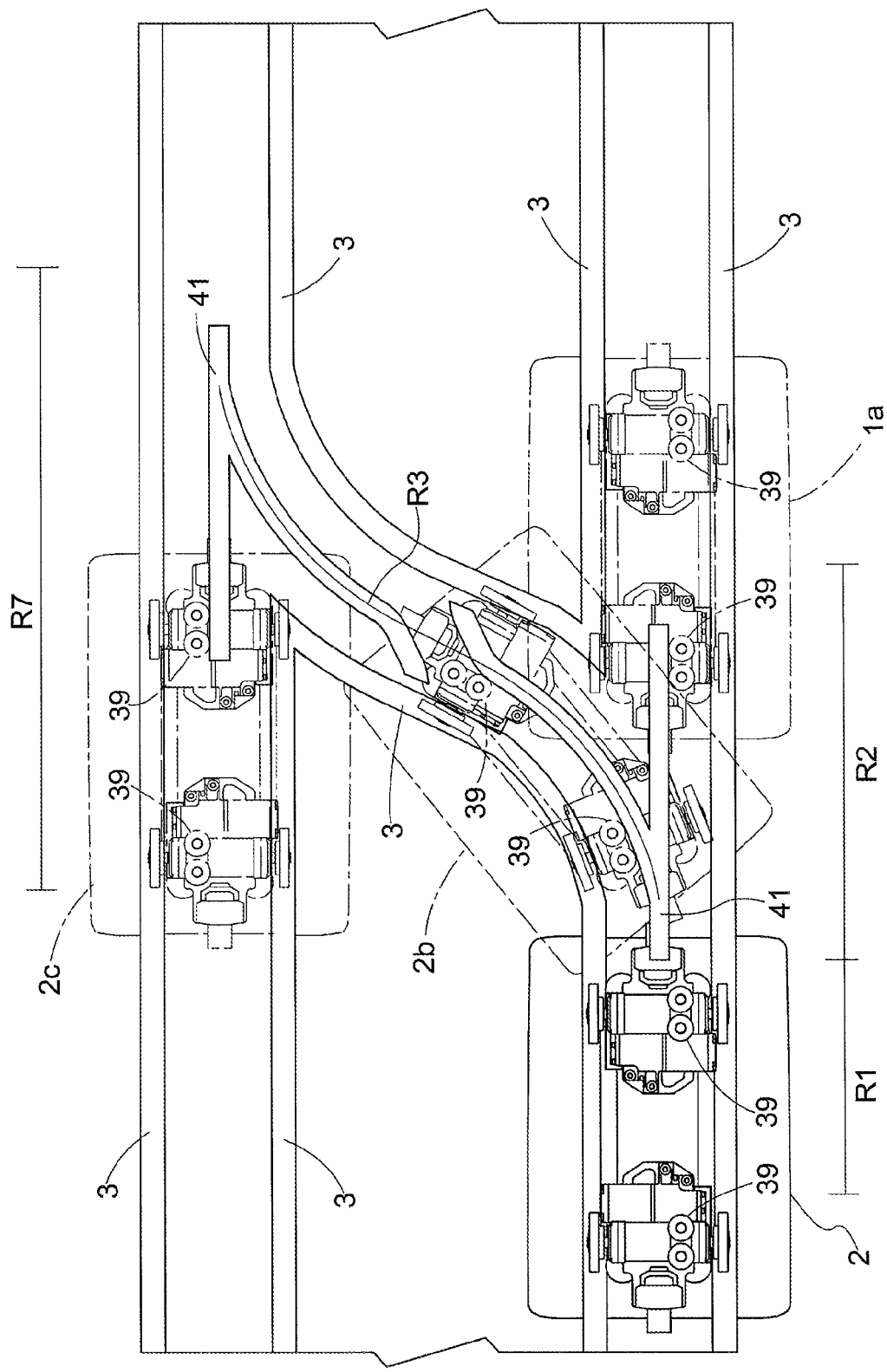
FIG. 9 shows how an article transport vehicle travels in a transfer area.
Figure 10:
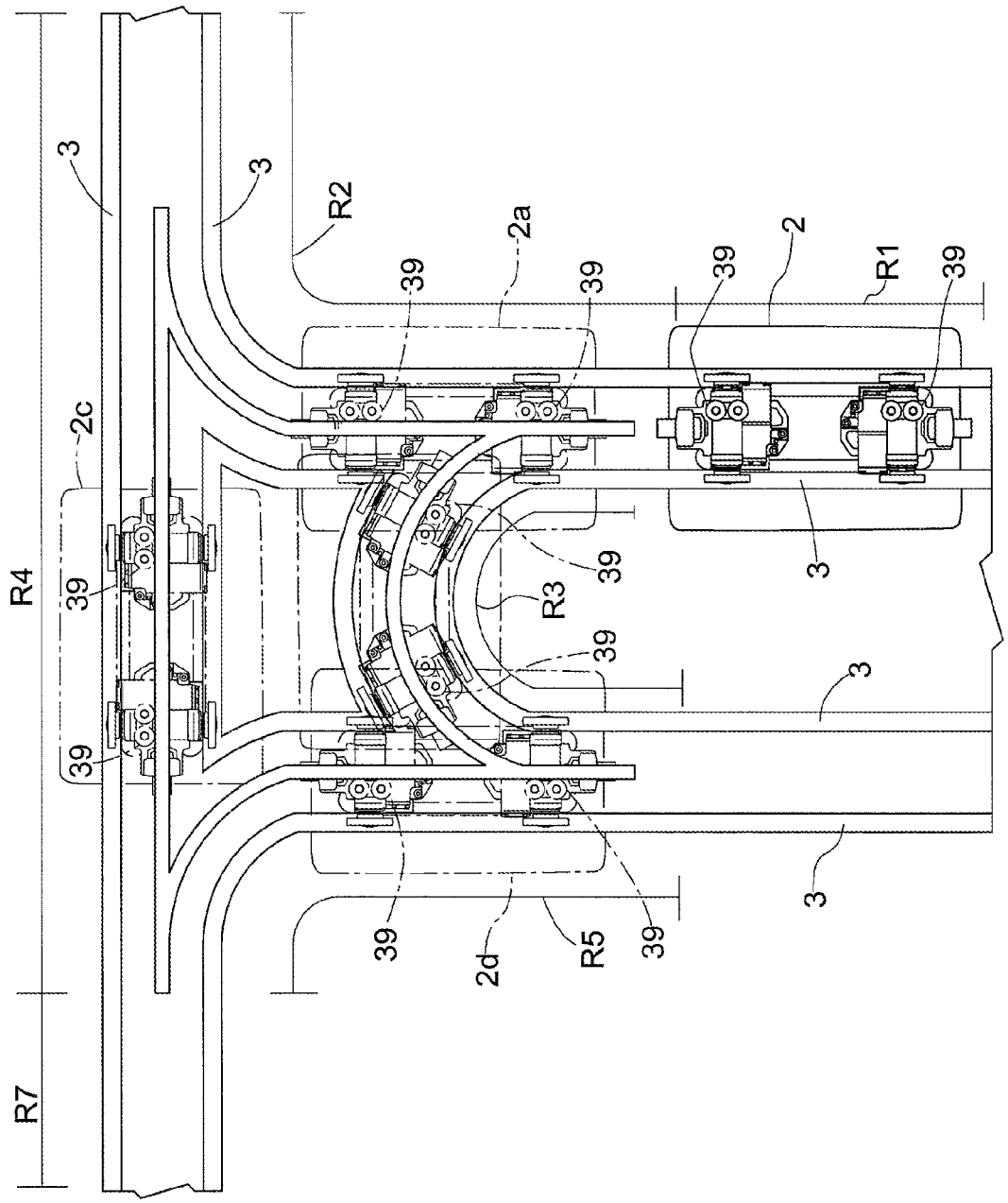
FIG. 10 shows how an article transport vehicle travels in a branching and merging area.

Thus, as shown in FIGS. 8-10, when an article transport vehicle 2 enters a managed area T, even if article transport vehicles 2 (for example, the article transport vehicle 2b shown in FIGS. 8-FIG. 10 with dashed lines and/or article transport vehicle 2d shown in FIG. 10 with dashed lines) exist in one of the second path R2 and the third path R3 (for example, third path R3) that has not been selected as a selected path (for example, second path R2) or in a path (for example, fifth path R5) that is not the subject path (for example, fourth path R4), a travel control of the article transport vehicle 2 that has entered the managed area T is performed to cause it to travel in the selected path (for example, second path R2) if another article transport vehicle 2 (for example, the article transport vehicle 2a shown in FIG. 8-FIG. 10 with dashed lines or the article transport vehicle 2c shown in FIG. 10 with a dashed line) does not exist in the selected path (for example, second path R2) and in the subject path (for example, fourth path R4). This allows the frequency with which the article transport vehicle 2 is caused to stop to be reduced compared to a case where the article transport vehicle 2 which enters a managed area T is caused to stop simply because another article transport vehicle 2 exists in the managed area T. Thus, the transport efficiency can be improved.

Alternative Embodiments (1) In the embodiment described above, an example is described in which the guided members are detected by detecting members. However, the detecting members may detect another portion of an article transport vehicle, for example, the base frame of a travel portion, etc.

In addition, an example is described in which the detecting device that functions as a first detector is provided to each article transport vehicle. However, the first detectors may be provided on the ground side (e.g., such that each is supported by a travel rail) to detect article transport vehicles.

(2) In the embodiment described above, the branching portion for the first path and the second path and the third path is located upstream of a connecting portion by which two paths are connected (for example, first connecting portion by which a secondary path and a merging path are connected). However, branching portions may be provided as follows.

For example, the branching portion for the first path and the second path and the third path may be located at the same position as a connecting portion by which two paths are connected (for example, first connecting portion by which a secondary path and a merging path are connected). More specifically, when a branching portion is located at the same position as a first connecting portion, it would be conceivable to form (a) the first path by a portion of a secondary path that extends upstream from the first connecting portion (branching portion), (b) the second path by a portion of a merging path that extends downstream from the first connecting portion (branching portion), and (c) the third path by a portion of the secondary path that extends downstream from the first connecting portion (branching portion). In this case, the second and third paths may be arranged such that the trajectory of the article transport vehicle traveling along the second path and the trajectory of the article transport vehicle traveling along the second path don't overlap with each other. Thus, by so arranging the second path and the third path, even if another article transport vehicle is at rest at the upstream end of the third path, the article transport vehicle that entered the managed area can travel in the second path without contacting this another article transport vehicle. Similarly, even if another article transport vehicle is at rest at the upstream end of the second path, the article transport vehicle that entered the managed area can travel in the third path without contacting this another article transport vehicle.

In addition, the branching portion for the first path and the second path and the third path may be located downstream of a connecting portion by which two paths are connected (for example, first connecting portion by which a secondary path and a merging path are connected). More specifically, when a branching portion located downstream of a first connecting portion, a branching portion may be provided at a position in a secondary path that is downstream of the first connecting portion (i.e., in the arc-shaped portion of the secondary path) and also at a position in a merging path that is downstream of the first connecting portion (i.e., in an intermediate portion of the merging path). And the first path may be formed by a portion of the secondary path that extends upstream from the first connecting portion, a portion of the secondary path from the first connecting portion to the branching portion, and a portion of the merging path from the first connecting portion to the branching portion. In addition, it would be conceivable to form the second path by a portion of the merging path that extends downstream from the branching portion, and to form the third path by a portion of the secondary path that extends downstream from its branching portion.

(3) In the embodiment described above, an example is described in which a managed area includes at least a branching area and a merging area. However, a managed area may include only a branching area.

Also, in the embodiment described above, an example is described in which areas are so arranged and located that a branching area and merging area are continuous with each other (so that a guide rail is installed). However, these areas may be so located and arranged that a branching area and a merging area may be spaced apart from each other. When a branching area and a merging area are spaced apart from each other, the area located between the branching area and the merging area may be included in the managed area. Alternatively, the branching area and the merging area may be defined to be two separate managed areas.

Summary of Embodiments Described Above

A brief summary of the article transport facility described above is provided next.

An article transport facility comprises an article transport vehicle configured to travel along travel paths to transport an article, and a controller for controlling the article transport vehicle, wherein the travel paths include a first path extending from outside a managed area to a branching portion located inside the managed area, a second path and a third path which are two different paths, each of which extends from the branching portion to outside the managed area, wherein a downstream end of the first path, an upstream end of the second path, and an upstream end of the third path are connected together at the branching portion in the managed area, wherein the controller is configured to select one of the second path and the third paths as a selected path, and to perform a travel control for causing the article transport vehicle to travel along the first path and the selected path, and to perform a stop control for causing the article transport vehicle which entered the managed area to stop in the first path. The article transport facility further comprises a first detector configured to detect whether the article transport vehicle traveling in the first path entered the managed area, a second detector configured to detect whether another article transport vehicle exists in a portion of the second path that is in the managed area, and a third detector configured to detect whether another article transport vehicle exists in a portion of the third path that is in the managed area, wherein the controller performs: (a) the stop control if the article transport vehicle is detected by the first detector, and presence of another article transport vehicle in the selected path is detected by the second detector or the third detector, and (b) the travel control if the article transport vehicle is detected by the first detector, and presence of another article transport vehicle is not detected in the selected path by the second detector or the third detector.

With the arrangement described above, when the travel control is performed by the controller, the article transport vehicle travels in the first path and then the selected path (the second path or the third path) and thus through the managed area.

And if the article transport vehicle is detected by the first detector, and presence of another article transport vehicle in the selected path is detected by the second detector or the third detector, the controller suspends the travel control and performs the stop control to cause the article transport vehicle 2 to stop before it reaches the branching portion.

In addition, if the article transport vehicle is detected by the first detector, and presence of another article transport vehicle is not detected in the selected path by the second detector or the third detector, the controller, for example, continues to perform the travel control as before, or performs a momentary stop control and then restarts the travel control to cause the article transport vehicle to travel along the first path and then the selected path.

In other words, when an article transport vehicle enters the managed area, the travel control of the article transport vehicle that entered the managed area is performed to allow and cause it to travel in the selected path if another article transport vehicle does not exist in the selected path, even if another article transport vehicle exists in one of the second path and the third path that was not selected as the selected path. This allows the transport efficiency to be improved compared to a case where the article transport vehicle which enters a managed area caused to stop and remain at rest simply because another article transport vehicle exists in the managed area.

Here, the controller preferably includes a first controller, a second controller, and a third controller, wherein the first controller is preferably configured: (a) to learn a position of the article transport vehicle based on position information which indicates a travel position of the article transport vehicle and which is transmitted from the article transport vehicle traveling along the travel paths; (b) to transmit first permission information to the third controller if the first controller determines that another article transport vehicle does not exist in either of the second path and the third path in the managed area; and (c) to transmit first prohibition information to the third controller if the first controller determines that another article transport vehicle exists in at least one of the second path and the third path in the managed area, wherein the second controller is preferably configured: (a) to transmit second permission information to the third controller if the article transport vehicle is detected by the first detector and presence of another article transport vehicle is not detected in the selected path by the second detector and the third detector; and (b) to transmit second prohibition information to the third controller if the article transport vehicle is detected by the first detector and presence of another article transport vehicle in the selected path is detected by the second detector or the third detector, wherein, with regard to a control of the article transport vehicle in the managed area, and regardless of whether the first permission information is received, the third controller is preferably configured to perform the stop control if the second prohibition information is received and to perform the travel control if the second permission information is received.

With the arrangement described above, the first controller can learn the position of the article transport vehicle based on position information which indicates the travel position of the article transport vehicle and which is transmitted from the article transport vehicle traveling along the travel paths. However, the first controller cannot learn or keep track of the position of an article transport vehicle that is not traveling along the travel paths. More specifically, the first controller cannot learn the position of, for example, an article transport vehicle placed in the second path or the third path by a worker. Thus, even if the first controller determines that no article transport vehicle exists in either the second path or the third path in the managed area, there is a possibility that an article transport vehicle may actually exist in the second path or the third path.

In contrast, the second controller can lean the presence of an article transport vehicle placed in the second path or the third path by a worker based on the detection information from the second detector and/or the third detector.

Thus, with regard to a control of the article transport vehicle in the managed area, and regardless of whether the first permission information is received, the third controller performs the stop control if the second prohibition information is received. Thus, the article transport vehicle that entered the managed area can be prevented from colliding with an article transport vehicle that was placed in the selected path by a worker as described above.

In addition, with a direction that is perpendicular to a travel direction of the article transport vehicle as seen along the vertical direction being defined to be a lateral direction, and with one direction along the lateral direction being a first lateral direction and a direction along the lateral direction that is opposite from the one direction being a second lateral direction, portions of the second path that are further downstream are preferably farther away in the first lateral direction from the third path, wherein guide rails are preferably provided with a guide rail splitting at the branching portion and with a guide rail arranged along each of the first path, the second path, and the third path, wherein the article transport vehicle is preferably provided with a guided member which can be moved to a first position and to a second position located on a second lateral direction side of the first position, wherein the article transport vehicle is preferably guided to move from the first path to the second path as a result of the article transport vehicle traveling with the guided member located in the first position and in contact with the guide rail from the first lateral direction side, wherein the article transport vehicle is preferably guided to move from the first path to the third path as a result of the article transport vehicle traveling with the guided member located in the second position and in contact with the guide rail from the second lateral direction side, wherein the second detector is preferably a second detecting device which is installed along the second path, and is configured to detect the guided member located in the first position, and wherein the third detector is preferably a third detecting device which is installed along the third path, and is configured to detect the guided member located in the second position.

With the arrangement described above, when the article transport vehicle travels in the second path, the guided member is located on the first direction side of the guide rail. And when the article transport vehicle travels in the third path, the guided member is located on the second direction side of the guide rail. And the guided member which is moved to a different position depending on the path in which the article transport vehicle travels can be properly detected by either the second detector or the third detector. Therefore, this arrangement facilitates a proper detection of the path in which the article transport vehicle is traveling.

In addition, the travel paths preferably further include a fourth path which extends from outside the managed area and merges into a portion of the second path that is in the managed area, and a fifth path which extends from outside the managed area and merges into a portion of the third path that is in the managed area, wherein the second detector is preferably configured to detect whether another article transport vehicle exists in a portion of the fourth path that is in the managed area as well as in the portion of the second path that is in the managed area, wherein the third detector is preferably configured to detect whether another article transport vehicle exists in a portion of the fifth path that is in the managed area as well as in the portion of the third path that is in the managed area, wherein, with one of the fourth path and the fifth path that merges into the selected path being defined as a subject path, the controller is preferably configured to perform the stop operation if the article transport vehicle is detected by the first detector and presence of another article transport vehicle is detected in at least one of the selected path and the subject path by the second detector or the third detector; and to perform the travel operation if the article transport vehicle is detected by the first detector and presence of another article transport vehicle is not detected in either of the selected path and the subject path by the second detector or the third detector.

With the arrangement described above, when the second path is selected as the selected path, the travel control is performed if an article transport vehicle is not detected in the second path which is the selected path, or in the fourth path which is the subject path, even if another article transport vehicle is detected in the third path or in the fifth path. Also, when the third path is selected as the selected path, the travel control is performed if an article transport vehicle is not detected in the third path which is the selected path, or in the fifth path which is the subject path, even if another article transport vehicle is detected in the second path or in the fourth path. Therefore, since the frequency with which the article transport vehicle is caused to remain at rest can be reduced, the transport efficiency can be improved.

And when the second path is selected as the selected path, the stop control is performed if another article transport vehicle is detected in the second path which is the selected path or in the fourth path which is the subject path, to cause the first article transport vehicle to wait until the other article transport vehicle is moved out of the path and is no longer detected. And when the third path is selected as the selected path, the stop control is performed if another article transport vehicle is detected in the third path which is the selected path or in the fifth path which is the subject path, to cause the first article transport vehicle to wait until the other article transport vehicle is moved out of the path and is no longer detected. Therefore, collisions between article transport vehicles can be avoided.

Thus, the transport efficiency of a facility can be improved in the paths in which both a branching path and a merging path exist, while avoiding collisions between article transport vehicles.

What is claimed is:
1. An article transport facility comprising:
   an article transport vehicle configured to travel along travel paths to transport an article;
   a controller for controlling the article transport vehicle;
   wherein the travel paths include a first path extending from outside a managed area to a branching portion located inside the managed area, a second path and a third path which are two different paths, each of which extends from the branching portion to outside the managed area, wherein a downstream end of the first path, an upstream end of the second path, and an upstream end of the third path are connected together at the branching portion in the managed area, wherein the controller is configured to select one of the second path and the third paths as a selected path, and to perform a travel control for causing the article transport vehicle to travel along the first path and the selected path, and to perform a stop control for causing the article transport vehicle which entered the managed area to stop in the first path, wherein the article transport facility further comprises a first detector configured to detect whether the article transport vehicle traveling in the first path entered the managed area, a second detector configured to detect whether another article transport vehicle exists in a portion of the second path that is in the managed area, and a third detector configured to detect whether another article transport vehicle exists in a portion of the third path that is in the managed area, and wherein the controller performs: (a) the stop control if the article transport vehicle is detected by the first detector, and presence of another article transport vehicle in the selected path is detected by the second detector or the third detector, and (b) the travel control if the article transport vehicle is detected by the first detector, and presence of another article transport vehicle is not detected in the selected path by the second detector or the third detector.

2. The article transport facility as defined in claim 1, wherein the controller includes a first controller, a second controller, and a third controller, wherein the first controller is configured: (a) to learn a position of the article transport vehicle based on position information which indicates a travel position of the article transport vehicle and which is transmitted from the article transport vehicle traveling along the travel paths; (b) to transmit first permission information to the third controller if the first controller determines that another article transport vehicle does not exist in either of the second path and the third path in the managed area; and (c) to transmit first prohibition information to the third controller if the first controller determines that another article transport vehicle exists in at least one of the second path and the third path in the managed area, wherein the second controller is configured: (a) to transmit second permission information to the third controller if the article transport vehicle is detected by the first detector and presence of another article transport vehicle is not detected in the selected path by the second detector and the third detector; and (b) to transmit second prohibition information to the third controller if the article transport vehicle is detected by the first detector and presence of another article transport vehicle in the selected path is detected by the second detector or the third detector, and wherein, with regard to a control of the article transport vehicle in the managed area, and regardless of whether the first permission information is received, the third controller is configured to perform the stop control if the second prohibition information is received and to perform the travel control if the second permission information is received.

3. The article transport facility as defined in claim 2, wherein with a direction that is perpendicular to a travel direction of the article transport vehicle as seen along the vertical direction being defined to be a lateral direction, and with one direction along the lateral direction being a first lateral direction and a direction along the lateral direction that is opposite from the one direction being a second lateral direction, portions of the second path that are further downstream are farther away in the first lateral direction from the third path, wherein guide rails are provided with a guide rail splitting at the branching portion and with a guide rail arranged along each of the first path, the second path, and the third path, wherein the article transport vehicle is provided with a guided member which can be moved to a first position and to a second position located on a second lateral direction side of the first position, wherein the article transport vehicle is guided to move from the first path to the second path as a result of the article transport vehicle traveling with the guided member located in the first position and in contact with the guide rail from the first lateral direction side, wherein the article transport vehicle is guided to move from the first path to the third path as a result of the article transport vehicle traveling with the guided member located in the second position and in contact with the guide rail from the second lateral direction side, wherein the second detector is a second detecting device which is installed along the second path, and is configured to detect the guided member located in the first position, and wherein the third detector is a third detecting device which is installed along the third path, and is configured to detect the guided member located in the second position.

4. The article transport facility as defined in claim 1, wherein the travel paths further include a fourth path which extends from outside the managed area and merges into a portion of the second path that is in the managed area, and a fifth path which extends from outside the managed area and merges into a portion of the third path that is in the managed area, wherein the second detector is configured to detect whether another article transport vehicle exists in a portion of the fourth path that is in the managed area as well as in the portion of the second path that is in the managed area, wherein the third detector is configured to detect whether another article transport vehicle exists in a portion of the fifth path that is in the managed area as well as in the portion of the third path that is in the managed area, wherein, with one of the fourth path and the fifth path that merges into the selected path being defined as a subject path, the controller is configured to perform the stop operation if the article transport vehicle is detected by the first detector and presence of another article transport vehicle is detected in at least one of the selected path and the subject path by the second detector or the third detector; and to perform the travel operation if the article transport vehicle is detected by the first detector and presence of another article transport vehicle is not detected in either of the selected path and the subject path by the second detector or the third detector.

* * * * *